(12) United States Patent
Muchherla et al.

(10) Patent No.: US 10,418,122 B2
(45) Date of Patent: *Sep. 17, 2019

(54) THRESHOLD VOLTAGE MARGIN ANALYSIS

(71) Applicant: Micron Technology, Inc., Boise, ID (US)

(72) Inventors: Kishore K. Muchherla, San Jose, CA (US); Sampath K. Ratnam, Boise, ID (US); Abolfazl Rashwand, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 126 days.

This patent is subject to a terminal disclaimer.

(21) Appl. No.: 15/642,410

(22) Filed: Jul. 6, 2017

(65) Prior Publication Data

US 2017/0301408 A1 Oct. 19, 2017

Related U.S. Application Data

(63) Continuation of application No. 14/681,618, filed on Apr. 8, 2015, now Pat. No. 9,728,278.

(Continued)

(51) Int. Cl.
| | |
|---|---|
| *G06F 11/00* | (2006.01) |
| *G11C 29/50* | (2006.01) |
| *G11C 29/52* | (2006.01) |
| *G11C 5/14* | (2006.01) |
| *G11C 16/34* | (2006.01) |

(Continued)

(52) U.S. Cl.
CPC .... *G11C 29/50004* (2013.01); *G06F 11/1048* (2013.01); *G11C 5/148* (2013.01); *G11C 16/349* (2013.01); *G11C 16/3418* (2013.01); *G11C 29/42* (2013.01); *G11C 29/52* (2013.01)

(58) Field of Classification Search
CPC .............. G06F 3/0679; G06F 11/1441; G06F 11/1048; G06F 11/1471; G06F 3/0619; G06F 11/0751; G11C 16/225; G11C 29/42; G11C 5/148; G11C 16/3418; G11C 16/30; G11C 29/50004; G11C 7/24; G11C 8/20

See application file for complete search history.

(56) References Cited

U.S. PATENT DOCUMENTS

| | | |
|---|---|---|
| 5,467,309 A | 11/1995 | Tanaka et al. |
| 5,973,957 A | 10/1999 | Tedrow |

(Continued)

FOREIGN PATENT DOCUMENTS

| | | |
|---|---|---|
| JP | 2003051196 A | 2/2003 |
| JP | 2004103089 A | 4/2004 |

*Primary Examiner* — Loan L. T. Truong

(74) *Attorney, Agent, or Firm* — Brooks, Cameron & Huebsch, PLLC

(57) ABSTRACT

The present disclosure is related to a threshold voltage margin analysis. An example embodiment apparatus can include a memory and a controller coupled to the memory. The controller is configured to determine a previous power loss of a memory to be an asynchronous power loss, and identify a portion of the memory last subject to programming operations during the determined asynchronous power loss. The controller is further configured to perform a threshold voltage (Vt) margin analysis on the portion of the memory responsive to the determined asynchronous power loss.

20 Claims, 4 Drawing Sheets

Related U.S. Application Data

(60) Provisional application No. 62/068,364, filed on Oct. 24, 2014.

(51) Int. Cl.
*G11C 29/42* (2006.01)
*G06F 11/10* (2006.01)

(56) References Cited

U.S. PATENT DOCUMENTS

| | | | |
|---|---|---|---|
| 6,115,291 A | 9/2000 | Lakhani | |
| 6,170,066 B1* | 1/2001 | See | G06F 11/1441 713/340 |
| 6,243,839 B1 | 6/2001 | Roohparvar | |
| 6,252,803 B1 | 6/2001 | Fastlow et al. | |
| 6,288,944 B1 | 9/2001 | Kawamura | |
| 6,345,001 B1 | 2/2002 | Mokhlesi | |
| 6,381,550 B1 | 4/2002 | Hsia et al. | |
| 6,385,090 B1 | 5/2002 | Kitazaki | |
| 6,483,751 B2 | 11/2002 | Chen et al. | |
| 6,493,280 B2 | 12/2002 | Mihnea et al. | |
| 6,542,410 B2 | 4/2003 | Hirano | |
| 6,634,004 B1 | 10/2003 | Yamada et al. | |
| 6,643,187 B2 | 11/2003 | Mokhlesi | |
| 6,654,292 B2 | 11/2003 | Keays | |
| 6,798,699 B2 | 9/2004 | Mihnea et al. | |
| 6,807,101 B2 | 10/2004 | Ooishi et al. | |
| 6,816,409 B2 | 11/2004 | Tanaka | |
| 6,831,865 B2 | 12/2004 | Chang et al. | |
| 6,903,974 B2 | 6/2005 | Wooldridge | |
| 6,907,497 B2 | 6/2005 | Hosono et al. | |
| 7,035,967 B2 | 4/2006 | Chang et al. | |
| 7,085,167 B2 | 8/2006 | Lee et al. | |
| 7,099,220 B2 | 8/2006 | Mihnea et al. | |
| 7,149,121 B2 | 12/2006 | Lin et al. | |
| 7,180,781 B2 | 2/2007 | Abedifard et al. | |
| 7,221,593 B2 | 5/2007 | Roohparvar | |
| 7,224,604 B2 | 5/2007 | Lasser | |
| 7,254,757 B2 | 8/2007 | Park et al. | |
| 7,319,615 B1 | 1/2008 | Park et al. | |
| 7,679,961 B2 | 3/2010 | Lee et al. | |
| 7,747,900 B2 | 6/2010 | Elliott et al. | |
| 7,830,718 B2* | 11/2010 | Sarin | G11C 16/3418 365/185.13 |
| 7,916,543 B2 | 3/2011 | Goda et al. | |
| 8,179,718 B2 | 5/2012 | Cho et al. | |
| 8,243,513 B2 | 8/2012 | Sarin et al. | |
| 8,291,297 B2 | 10/2012 | Coulson et al. | |
| 8,365,030 B1 | 1/2013 | Choi et al. | |
| 8,661,301 B1* | 2/2014 | Yen | G11C 16/22 711/103 |
| 8,806,115 B1* | 8/2014 | Patel | G06F 11/1471 711/103 |
| 9,037,946 B2 | 5/2015 | Jeon et al. | |
| 9,142,296 B2 | 9/2015 | Kim et al. | |
| 9,245,653 B2 | 1/2016 | Hyun et al. | |
| 9,431,069 B2* | 8/2016 | Lim | G11C 5/148 |
| 9,454,420 B1 | 9/2016 | Tai et al. | |
| 9,459,881 B2* | 10/2016 | Tuers | G06F 9/4401 |
| 9,728,278 B2* | 8/2017 | Muchherla | G11C 29/50004 |
| 9,921,898 B1* | 3/2018 | Miller | G06F 11/073 |
| 10,025,669 B2* | 7/2018 | Tabachnik | G06F 11/1441 |
| 10,048,879 B2* | 8/2018 | Chen | G11C 7/24 |
| 10,168,905 B1* | 1/2019 | Kim | G06F 3/0604 |
| 2003/0014690 A1* | 1/2003 | Frimout | G06F 11/1441 714/20 |
| 2005/0219896 A1 | 10/2005 | Chen et al. | |
| 2006/0062049 A1* | 3/2006 | Lee | G11C 16/225 365/185.22 |
| 2007/0055816 A1* | 3/2007 | Wang | G06F 3/0619 711/103 |
| 2008/0195903 A1 | 8/2008 | Zipprich-Rasch | |
| 2008/0307373 A1 | 12/2008 | Kobayashi | |
| 2009/0049334 A1* | 2/2009 | Elliott | G06F 3/0619 714/5.11 |
| 2010/0061150 A1* | 3/2010 | Wu | G11C 16/349 365/185.08 |
| 2010/0082177 A1* | 4/2010 | Chang | H02J 3/1814 700/298 |
| 2010/0169543 A1* | 7/2010 | Edgington | G06F 12/0246 711/103 |
| 2011/0131365 A1* | 6/2011 | Zhang | G06F 11/1441 711/103 |
| 2011/0150060 A1* | 6/2011 | Huang | H04L 25/03057 375/224 |
| 2011/0278949 A1 | 11/2011 | Tsai et al. | |
| 2012/0041696 A1 | 2/2012 | Sanderford, Jr. et al. | |
| 2012/0101640 A1 | 4/2012 | Stapelfeldt | |
| 2013/0047132 A1 | 2/2013 | Kim et al. | |
| 2013/0054871 A1 | 2/2013 | Lassa | |
| 2014/0223231 A1* | 8/2014 | Mangold | G11C 16/16 714/22 |
| 2014/0223399 A1* | 8/2014 | Sato | G06F 17/5081 716/109 |
| 2014/0258755 A1* | 9/2014 | Stenfort | G06F 1/30 713/323 |
| 2014/0304560 A1* | 10/2014 | Narasimha | G06F 11/0727 714/704 |
| 2014/0365146 A1 | 12/2014 | Russell | |
| 2016/0048150 A1 | 2/2016 | Chiang et al. | |
| 2016/0070336 A1* | 3/2016 | Kojima | G06F 12/0246 711/103 |
| 2016/0099078 A1 | 4/2016 | Luo et al. | |
| 2016/0118143 A1* | 4/2016 | Muchherla | G11C 29/50004 714/721 |
| 2016/0211033 A1 | 7/2016 | Lee et al. | |
| 2016/0268000 A1* | 9/2016 | Thompson | G11C 16/30 |
| 2018/0129452 A1* | 5/2018 | Li | G06F 3/0659 |

* cited by examiner

THRESHOLD VOLTAGE MARGIN ANALYSIS

PRIORITY APPLICATION INFORMATION

This application is a Continuation of U.S. application Ser. No. 14/681,618 filed Apr. 8, 2015, which claims priority to U.S. Provisional Application Ser. No. 62/068,364, filed Oct. 24, 2014, the specification of which is incorporated herein by reference.

TECHNICAL FIELD

The present disclosure relates generally to semiconductor memory and methods, and more particularly, to memory cell threshold voltage margin analysis.

BACKGROUND

Memory devices are typically provided as internal, semiconductor, integrated circuits in computers or other electronic devices. There are many different types of memory including volatile and non-volatile memory. Volatile memory can require power to maintain its data (e.g., host data, error data, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory. Memory is used herein to refer to a group of memory cells, which may be arranged as a memory array, a memory device, a memory system, or other one of various configurations.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Upon power loss while writing data to a memory device, memory cells can be left in an uncertain condition. Memory can have memory cells that are partially (e.g., shallowly) programmed but appears to be erased. Memory can have memory cells that are incompletely programmed to within a target threshold voltage range of an intended data state but perhaps only barely within so as to marginally pass a verification read. Memory can have memory cells that are insufficiently programmed with respect to the target threshold voltage range of the intended data state, which can result in Error Correction Code (ECC) errors. Condition of memory cells in progress of being programmed when a power loss occurs can vary depending on the data state being programmed, location of the memory cell with respect to an upper page, lower page, even page, odd page, and number of data states to which the memory cell is being programmed, among others. Upon power-up, the various conditions of the memory cells of the memory can affect data integrity of the memory device and performance of the host computing system in different ways.

Detection of a number of ECC errors associated with a memory can result in the host computing system identifying a portion of the memory (e.g., page) as being corrupted, which can cause the host computing system to waste time and energy attempting to correct the ECC errors and/or unnecessarily stop using the portion of the memory. Memory that has memory cells that are shallowly programmed (e.g., not fully erased) but appear to be erased can be sensitive to Program Disturb if the host computing system attempts to program new data to the memory cells on top of the shallowly programmed condition of the memory cells. Memory cells that are incompletely programmed within a threshold voltage range but pass a verification read can be more susceptible to data retention issues under certain conditions such as at higher temperatures.

Power loss while erasing data from a memory (e.g., programming a memory cell to an erase state) can result in partially erased pages that are susceptible to Disturb and misplacement. Accordingly, apparatus and methods to assess and address memory cell conditions following a power loss can improve operation of a memory device.

DETAILED DESCRIPTION

Figure 1:
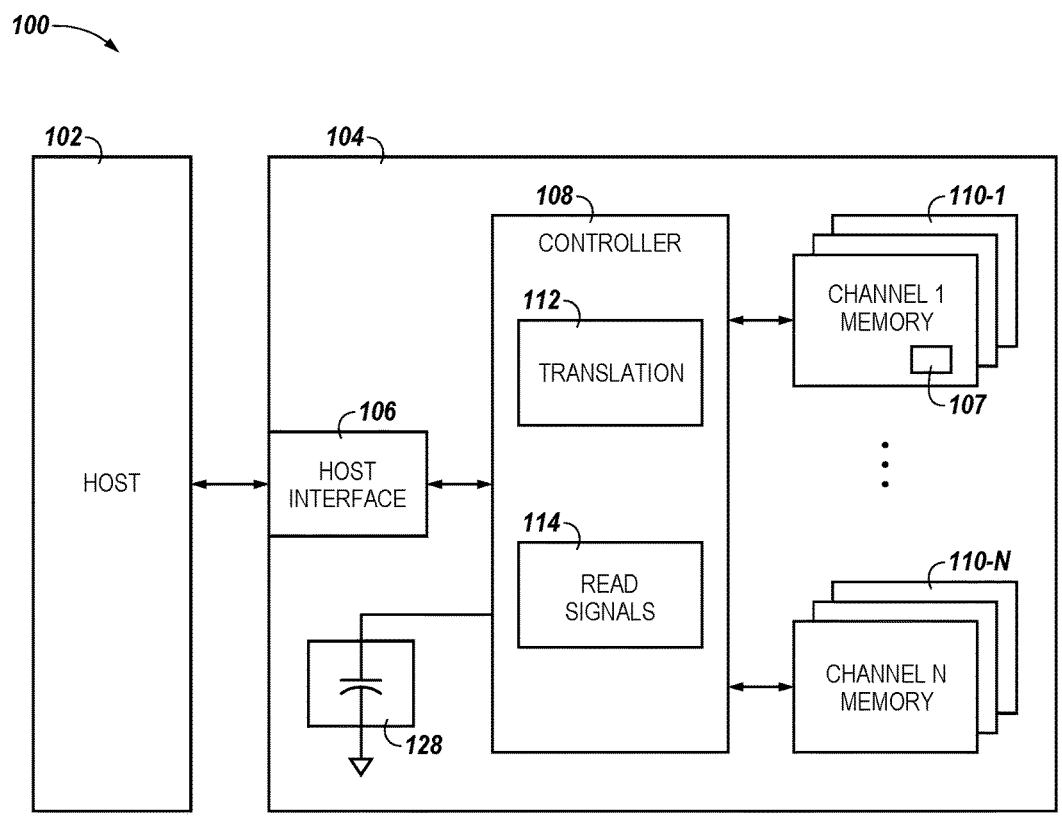
FIG. 1 is a block diagram of an apparatus in the form of a computing system including at least one memory system in accordance with a number of embodiments of the present disclosure.

The present disclosure is related to a threshold voltage margin analysis. An example embodiment apparatus can include a memory and a controller coupled to the memory. The controller is configured to determine a previous power loss of a memory to be an asynchronous power loss, and identify a portion of the memory last subject to programming operations during the determined asynchronous power loss. The controller is further configured to perform a threshold voltage (Vt) margin analysis on the portion of the memory responsive to the determined asynchronous power loss.

According to various embodiments of the present disclosure, recovery from a power loss can include performing a threshold voltage (Vt) margin analysis to determine whether a particular portion of memory (e.g., a page, block, etc.) can be used for data operations (e.g., READ, programming such as WRITE, erase, etc.). Vt margin analysis performed after a power loss can be used to assess a condition of a particular portion of memory can mitigate data loss, help to avoid premature block retirement, and improve overall system performance by minimizing the time and energy associated with misguide corrective actions due to misdiagnosed and undiagnosed memory conditions. According to some embodiments, Vt margin analysis can be performed after a power loss to determine if a read window budget is adequate when a last written page is tested with increased read voltage.

Ideally a host computing system in communication with a memory, such as a NAND Flash based memory device, can notify a memory controller prior to an imminent power loss with sufficient lead time ahead of the power loss. In this manner, the memory device can exit in-progress operations in an orderly fashion. However, there can be occasions when power to the memory is abruptly disconnected, a scenario commonly referred to as an asynchronous power loss.

One previous hardware approach for facilitating an orderly shutdown of a memory in response to an imminent power loss is to provide sufficient hold-up capacitance to provide energy for accomplishing an orderly power down of the memory. For example, a memory device can comprise a hold-up capacitance of sufficient size to provide the necessary stored energy to allow the memory to conclude in-progress operations. However, the cost of this hardware approach includes the additional expense for hold-up capacitance and increased hardware footprint occupied by the hold-up capacitance.

A power loss initiated by a host computing system can provide an indication (e.g., imprint) to a memory to indicate to the memory that the previous power down was initiated by the host, and thus orderly. Without this indication, the memory can proceed based on a previous power loss being an asynchronous power loss. Such an indication can be checked for by the memory upon power-up. Absent such an indication, the memory can proceed to determine whether any programming operations were in-process at the time of that power loss that left the memory in an uncertain or incorrect condition.

Where memory device cost and/or size are more important considerations, such as for solid state drive (SSD) and smaller form factor NAND FLASH modules, providing hold-up capacitance can be an infeasible solution for managing sudden power loss. However, without hold-up capacitance an orderly power down of the memory may not be possible. If the memory is in-process of certain programming operations at the time of power loss (e.g., WRITE operation, ERASE operation, etc.) some portions (e.g., pages) of the memory can be left in an incompletely programmed and/or unstable condition. Continuing to use these portions of the memory device can create uncorrectable failures, trigger unnecessary retirement of portions of the memory device (e.g., blocks), and force the memory device to implement WRITE protect techniques.

Memory device programming operations can be performed in steps (e.g., via multiple programming pulses). The time to complete program and erase operations can range from several hundred micro-seconds to a few milliseconds. The Vt state of a page can be a strong function of the point during a programming operation at which the power loss occurred. In the case of programming operations, if the power loss happens during an early stage of programming, pages can be partially programmed but read as erased (e.g., blank) pages by the memory controller (e.g., firmware). Continuing to use these partially-programmed pages can result in Disturb, and the page can be at increased risk of misplacement. If the power loss happens during a later stage of programming, the Vt of the pages may have reached an intended data state but the Read Window Budget (RWB) margins can be weaker resulting in data retention issues.

If the power loss happens during an intermediate stage of programming, then the Vt can be in disarray resulting in uncorrectable errors (e.g., uncorrectable error correction code (ECC) errors). Power loss during an intermediate stage of programming can be detected by the memory controller, which can trigger corrective action. However, power loss during initial and/or later stage of programming may not be detected using default read voltages, which can result in reliability issues when these pages are subsequently used for READ operations and/or programming operations.

If a power loss happens during an erase operation, the Vt of a memory cell can be in an incompletely erased state with the memory cell appearing to be erased. The consequences of such memory cell condition are similar to those associated with power loss during an early stage of programming previously described. Risks associated with memory cells not being fully programmed to an intended data or erased state can also increase proportional to the number of bits stored per memory cell since RWBs shrink as the number of Vt levels per memory cell increase.

According to some embodiments, a memory controller can be configured to identify a portion of the memory last subject to erase operations at the time of an asynchronous power loss, and perform a threshold voltage (Vt) margin analysis with respect to an erased state on the portion of the memory. For example, the controller can be configured to determine that the portion of the memory is indicated as being erased and that the portion of the memory is not fully programmed to the erased state. Similar to performing a Vt margin analysis on a last written page, a memory controller can be configured to perform an erase verify operation on the portion of the memory using a read voltage that is different (e.g., less) than a default erase verify operation read voltage, in order to determine whether a read window budget (RWB) associated with the erased data state is adequate. The controller can also be configured to increase the Vt for programming operations associated with the portion of the memory by a predetermined amount.

The present disclosure provides an effective way to accurately determine whether memory operations were in-process, and if an abrupt power down has left the memory in unstable or uncertain Vt state. According to various embodiments, the controller can initially scan for the last written page (LWP) on the memory. If the last written page is ECC correctible, then the power loss may have happened at the final stage of programming. If there is adequate read window budget (RWB) margin when the LWP is tested with increased read voltage, a check can be performed, for example, by increasing the Lower Page read voltage by a pre-determined voltage amount or percentage to determine. If the LWP looks normal for the check, then one conclusion is that power loss did not happen during a final stage of programming.

If power loss did not happen during a final stage of programming, whether the power loss happened during the early stage of programming of one a page subsequent to LWP can be investigated. For instance, one or more pages subsequent to the LWP can be checked using a read voltage that is reduced from a default value. According to some embodiments, one or more pages subsequent to the LWP can be checked using a read voltage adjusted to a lowest possible voltage corresponding to a particular data state. Also, a source shift can be implemented to increase the Vt of a portion (e.g., entire page) by a pre-determined voltage value or percentage.

This source shift approach provides an extra guard band in the Vt in the vicinity of a data state in order to weed out portions of memory (e.g., one or more pages) that may be incompletely programmed but look as if in an erased state. Any uncorrectable error during the above-mentioned check(s) can be considered a probable candidate that an asynchronous power loss occurred while memory WRITE/ ERASE operations were in-process. The memory and/or host computing system can take corrective actions such as to stop using the portion of memory (e.g., block), or can program dummy data on at least the pages determined as being affected by power loss and/or additional pages as a precaution. This approach helps preserve the RWB margins, minimize the misplacement, and ensure data integrity.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N" and "M", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 321 may reference element "21" in FIG. 3, and a similar element may be referenced as 421 in FIG. 4. As will be appreciated, elements shown in the various embodiments herein can be added, exchanged, and/ or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including at least one memory system 104 in accordance with a number of embodiments of the present disclosure. As used herein, a memory system 104, a controller 108, or a memory device 110 might also be separately considered an "apparatus." The memory system 104 can be a solid state drive (SSD), for instance, and can include a host interface 106, a controller 108 (e.g., a processor and/or other control circuitry), and a number of memory devices 110-1, ..., 110-N (e.g., solid state memory devices such as charge-trapping NAND flash devices), which provide a storage volume for the memory system 104. The memory system 104 can be a single memory device.

As illustrated in FIG. 1, the controller 108 can be coupled to the host interface 106 and to the memory devices 110-1, ..., 110-N via a plurality of channels and can be used to send data between the memory system 104 and a host 102. A hold-up capacitance 128 may be coupled to the controller 108 and/or memory devices 110-1, ..., 110-N. The hold-up capacitance 128 may or may not be sufficient to provide enough energy for an orderly shut-down in the event of every power loss scenario. According to some embodiments of the present disclosure, the memory system 104 can be devoid of any hold-up capacitance 128.

The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors). Host 102 can also be a memory controller, such as where memory system 104 is a memory device (e.g., having an on-die controller).

The controller 108 can communicate with the memory devices 110-1, ..., 110-N to control data READ, WRITE, and erase operations, among other operations. The memory devices 110-1, ..., 110-N can include a plurality of memory arrays 107 on a single die, a plurality of memory arrays 107 on multiple dies, or a single memory array 107 on a single die. The controller 108 can be on the same die or a different die than any or all of the memory devices 110-1, ..., 110-N.

Figure 2:
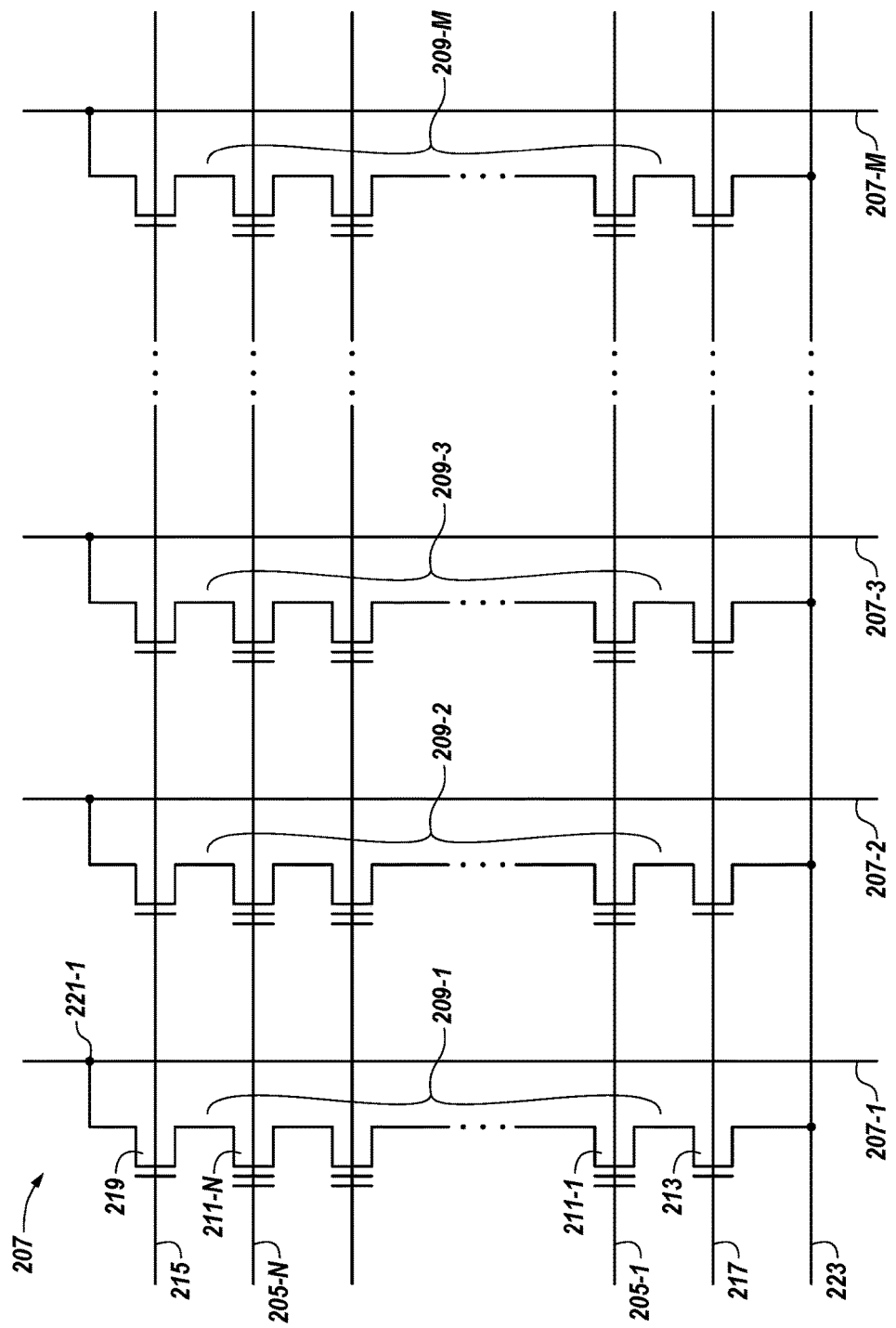
FIG. 2 illustrates a schematic diagram of a portion of a non-volatile memory array in accordance with a number of embodiments of the present disclosure.

FIG. 2 illustrates a schematic diagram of a portion of a non-volatile memory array in accordance with a number of embodiments of the present disclosure. The memory array can be contained within the memory devices 110-1, ..., 110-N illustrated in FIG. 1. The embodiment of FIG. 2 illustrates a NAND architecture non-volatile memory array. However, embodiments described herein are not limited to this example. As shown in FIG. 2, the memory array 201 includes access lines (e.g., word lines 205-1, ..., 205-N) and intersecting data lines (e.g., local bit lines 207-1, 207-2, 207-3, ..., 207-M). For ease of addressing in the digital environment, the number of word lines 205-1, ..., 205-N and the number of local bit lines 207-1, 207-2, 207-3, ..., 207-M can be some power of two (e.g., 256 word lines by 4,096 bit lines).

Memory array 201 includes NAND strings 209-1, 209-2, 209-3, ..., 209-M. Each NAND string includes non-volatile memory cells 211-1, ..., 211-N, each communicatively coupled to a respective word line 205-1, ..., 205-N. Each NAND string (and its constituent memory cells) is also associated with a local bit line 207-1, 207-2, 207-3, ..., 207-M. The memory cells 211-1, ..., 211-N of each NAND string 209-1, 209-2, 209-3, ..., 209-M are coupled in series source to drain between a source select gate (SGS) (e.g., a field-effect transistor (FET) 213) and a drain select gate (SGD) (e.g., FET 219). Each source select gate 213 is configured to selectively couple a respective NAND string to a common source 223 responsive to a signal on source select line 217, while each drain select gate 219 is configured to selectively couple a respective NAND string to a respective bit line responsive to a signal on drain select line 215.

As shown in the embodiment illustrated in FIG. 2, a source of source select gate 213 is coupled to a common source line 223. The drain of source select gate 213 is coupled to the source of the memory cell 211-1 of the corresponding NAND string 209-1. The drain of drain select gate 219 is coupled to bit line 207-1 of the corresponding NAND string 209-1 at drain contact 221-1. The source of drain select gate 219 is coupled to the drain of the last memory cell 211-N (e.g., a floating-gate transistor) of the corresponding NAND string 209-1.

In a number of embodiments, construction of the non-volatile memory cells 211-1, . . . , 211-N includes a source, a drain, a floating gate or other charge storage structure, and a control gate. The memory cells 211-1, . . . , 211-N have their control gates coupled to a word line, 205-1, . . . , 205-N, respectively. A NOR array architecture would be similarly laid out, except that the string of memory cells would be coupled in parallel between the select gates. Furthermore, a NOR architecture can provide for random access to the memory cells in the array (e.g., as opposed to page-based access as with a NAND architecture).

A number (e.g., a subset or all) of cells coupled to a selected word line (e.g., 205-1, . . . , 205-N) can be written and/or read together as a group. A number of cells written and/or read together can correspond to a page of data. As used herein, examples of high-level operations are referred to as writing or reading operations (e.g., from the perspective of a controller), whereas, with respect to the memory cells, such operations are referred to as programming or sensing. A group of cells coupled to a particular word line and programmed together to respective states can be referred to as a target page. A programming operation can include applying a number of program pulses (e.g., 16V-20V) to a selected word line in order to increase the threshold voltage (Vt) of selected cells coupled to that selected word line to a desired program voltage level corresponding to a targeted state.

Read operations can include sensing a voltage and/or current change of a bit line coupled to a selected cell in order to determine the state of the selected cell. The read operation can include precharging a bit line and sensing the discharge when a selected cell begins to conduct. Two different types of read operations are described herein (e.g., those using a ramping read signal versus using a plurality of discrete read signals).

Sensing the state of a selected cell can include providing a ramping read signal (e.g., −2V to +3V) to a selected word line, while providing a signal (e.g., a pass voltage such as 4.5V) to word lines coupled to the unselected cells of the string sufficient to place the unselected cells in a conducting state independent of the charge stored on the unselected cells. Alternatively, sensing the state of a selected cell could include applying discrete read signal levels (e.g., −0.05V, 0.5V, and 2V) to a selected word line, and thus to the control gate of a selected cell. The bit line corresponding to the selected cell being read and/or verified can be sensed to determine whether or not the selected cell conducts in response to the particular read signal applied to the selected word line. For example, the state of a selected cell can be determined by the word line voltage at which the bit line current reaches a particular reference current associated with a particular state.

Figure 3:
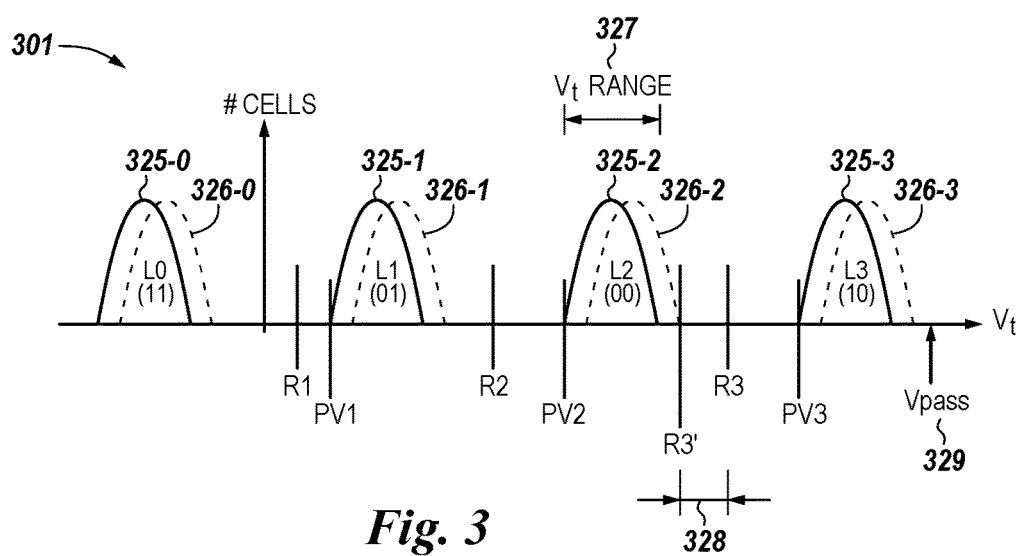
FIG. 3 illustrates a diagram of read voltage threshold distributions for programmed states in accordance with a number of embodiments of the present disclosure.

FIG. 3 illustrates a diagram 301 of a change in read voltage threshold distributions for programmed states based on a length of time after programming in accordance with a number of embodiments of the present disclosure. The example shown in FIG. 3 can represent, for example, memory cells 110-1, . . . , 110-N previously described in connection with FIG. 1. The example shown in FIG. 3 represents two-bit, e.g., four-state, memory cells. However, embodiments of the present disclosure are not limited to this example of two-bit memory cells.

FIG. 3 illustrates a diagram of read voltage threshold distributions for programmed states in accordance with a number of embodiments of the present disclosure. The example shown in FIG. 3 can represent, for example, memory cells 110-1, . . . , 110-N previously described in connection with FIG. 1. The example shown in FIG. 3 represents two-bit, e.g., four-state, memory cells. However, embodiments of the present disclosure are not limited to this example of two-bit memory cells.

FIG. 3 shows threshold voltage (Vt) distributions that represent four target states, e.g., L0, L1, L2, and L3, respectively, to which the memory cells can be programmed. Threshold voltage (Vt) distributions 325-0, 325-1, 325-2, and 325-3 (shown in FIG. 3 using solid lines) correspond to each of the four target states. Threshold voltage (Vt) distributions 326-0, 326-1, 326-2, and 326-3 (shown in FIG. 3 using dotted lines) correspond to each of the four target states after source shifting is implemented, which shifts the threshold voltage (Vt) distributions to increased voltage levels (e.g., for pages subsequent to the last written page when determined that an asynchronous power loss did not occur during final programming of the last written page and therefore may have occurred during an early stage of programming one or more pages subsequent to the last written page.

In operation, the memory cells in a selected block can be erased together such that they have a Vt level within Vt distribution 325-0 prior to being programmed. As such, distribution 325-0 can be referred to as an erased state and can represent a particular stored data state (target state L0), e.g., stored data such as binary "11". Target data state L1 can correspond to data 01, target data state L2 can correspond to data 00, and target data state L3 can correspond to data 10.

A number of sensing voltages are illustrated in FIG. 3. Such sensing voltages can include program verify voltages (e.g., PV1, PV2, PV3) and/or read voltages (R1, R2, R3). Voltage levels R1, R2, and R3 represent sensing voltages, e.g., read voltages, that can be used to distinguish between states L0, L1, L2, and L3 during a sensing operation. In a sensing operation performed on a selected memory cell in a memory, the unselected memory cells of the string can be biased with a pass voltage "Vpass" 329 so as to be in a conducting state.

FIG. 3 also shows a read voltage R3', which can be a reduced read voltage for pages subsequent to the last written page when determined that an asynchronous power loss did not occur during final programming of the last written page and therefore may have occurred during an early stage of programming one or more pages subsequent to the last written page. The alternate read voltage, R3', can be reduced from a default read voltage (e.g., R3) by a pre-determined voltage amount 328. Although a reduced read voltage is illustrated in FIG. 3 for only one read level, R3, the other read levels, R1 and/or R2, can also be reduced for performing a check pages subsequent to the last written page, as previously described.

Figure 4:
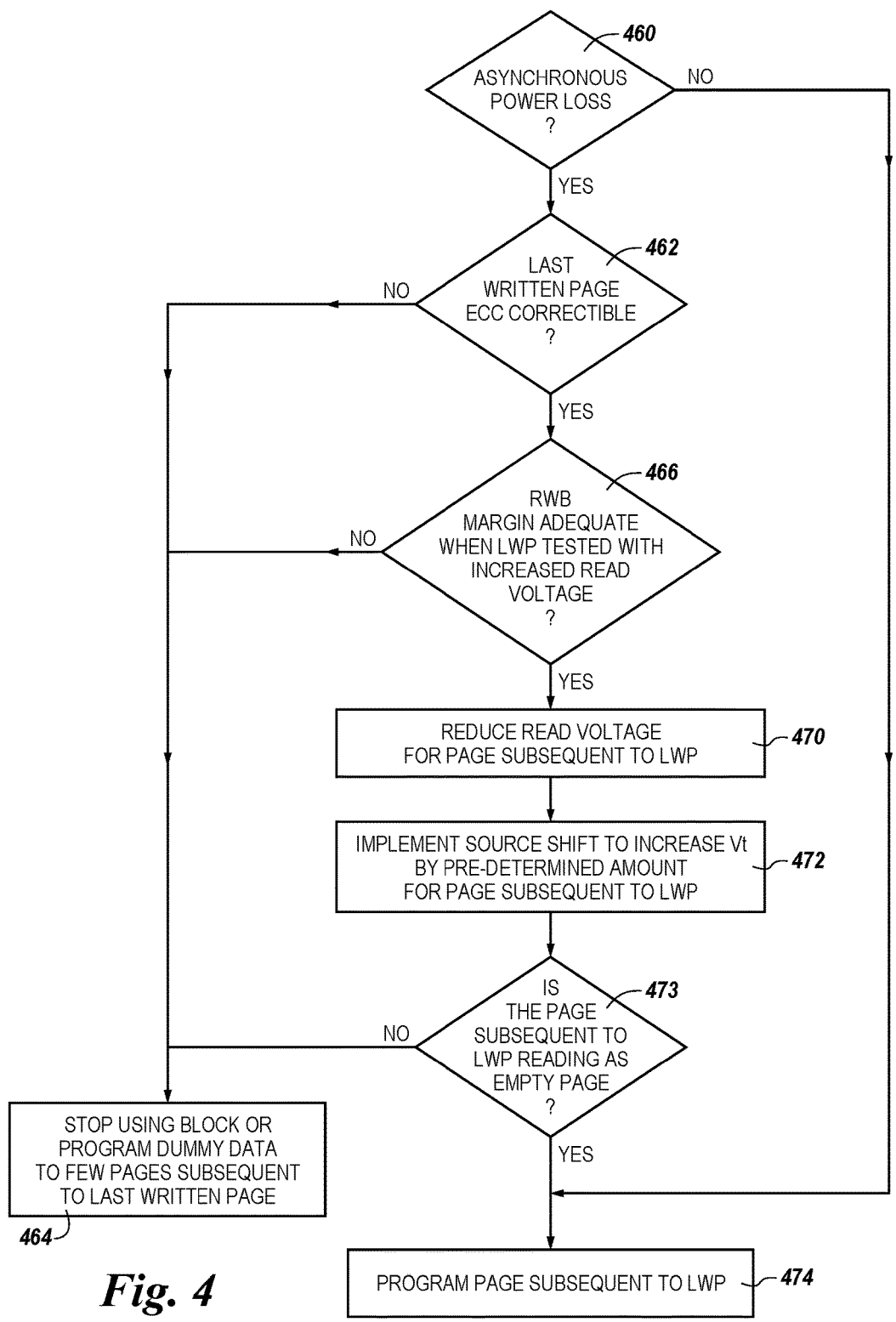
FIG. 4 is a flow chart illustrating a method of operating memory in accordance with a number of embodiments of the present disclosure.

FIG. 4 is a flow chart illustrating a method of operating memory in accordance with a number of embodiments of the present disclosure. At 460 the memory can check whether a prior power loss was an asynchronous power loss. For example, the memory can look for an indication that the prior power loss was initiated by the host computing system (e.g., host 102 illustrated in FIG. 1). The absence of such indication can cause the memory to proceed with testing associated with asynchronous power loss such a Vt margin analysis. If the prior power loss was not an asynchronous power loss, the memory can proceed with programming a page subsequent to the last written page, as indicated at 474 in FIG. 4, since the last written page was properly programmed where shut down of the memory was orderly.

If the prior power loss was an asynchronous power loss, the memory can identify the last written page and determine whether errors associated with the last written page are ECC correctible, as shown at 462 in FIG. 4. If the errors of the last written page are not ECC correctible, correction action can be taken in response, such as to stop using the block corresponding to the page having the ECC uncorrectable errors and/or programming dummy data to the last written page (and/or subsequent pages(s)), as shown at 464 in FIG. 4.

If errors associated with the last written page are ECC correctible, the last written page can be tested with increased read voltage (e.g., increased lower page read voltage) to determine whether RWB margin is adequate, as shown at 466. When RWB margin of the last written page is not adequate, the corrective action shown at 468 and discussed above can be implemented to address the inadequate RWB. Otherwise, when RWB margin of the last written page is adequate when the last written page is tested with an increased read voltage (indicating the asynchronous power loss did not occur during a final stage of programming the last written page), one or more actions can be taken with respect to pages subsequent to the last written page.

As shown at 470 in FIG. 4, one action can involve using a reduced read voltage for one or more pages subsequent to the last written page. Another action can involve implementing a source shifting to increase Vt by a pre-determined amount for one or more pages subsequent to the last written page, as shown at 472 in FIG. 4. Thereafter, it can be determined whether one or more pages subsequent to the last written page are reading as an empty page(s). If not reading as an empty page(s), correction action can be taken in response, such as to stop using the block corresponding to the page having the ECC uncorrectable errors and/or programming dummy data to the last written page (and/or subsequent pages(s)), as shown at 464 in FIG. 4. If the one or more pages subsequent to the last written page are reading as an empty page(s), the memory can proceed with programming a page subsequent to the last written page, as indicated at 474 in FIG. 4.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory; and
a controller coupled to the memory, wherein the controller is configured to, in response to determining that a previous power loss of the memory is an asynchronous power loss;
identify a portion of the memory last subject to programming operations during the asynchronous power loss;
perform a threshold voltage (Vt) margin analysis on the portion of the memory;
determine whether error correction code (ECC) errors on a last written page (LWP) are correctible; and
perform the Vt margin analysis on the LWP responsive to the ECC errors on the LWP being correctible.

2. The apparatus of claim 1, wherein the apparatus is devoid of hold-up capacitance sufficient to prevent the asynchronous power loss.

3. The apparatus of claim 1, wherein the controller is further configured to perform the Vt margin analysis prior to performing WRITE operations involving the portion of the memory.

4. The apparatus of claim 1, further comprising a host coupled to controller, wherein the controller is further configured to perform the Vt margin analysis prior to performing READ or WRITE operations involving the last written page of the memory responsive to a request by the host computing system.

5. The apparatus of claim 1, wherein the controller is further configured to perform the Vt margin analysis on a page subsequent to the LWP responsive to the ECC errors on the LWP being correctible.

6. The apparatus of claim 1, wherein the controller is further configured to perform READ operations on a page subsequent to the LWP using a read voltage less than a default read voltage responsive to the Vt margin analysis on the LWP indicating adequate Read Window Budget (RWB).

7. The apparatus of claim 1, wherein the controller is further configured to increase the Vt for programming operations on a page subsequent to the LWP by a predetermined amount responsive to the Vt margin analysis on the LWP indicating adequate Read Window Budget (RWB).

8. A method comprising:
determining a previous power loss of a memory to be an asynchronous power loss;
identifying a portion of the memory last subject to programming operations during the determined asynchronous power loss;
identifying a last written page (LWP) as the portion responsive to ECC errors of the LWP being correctable and Read Window Budget (RWB) margins being inadequate; and
performing a threshold voltage (Vt) margin analysis on the portion of the memory responsive to the determined asynchronous power loss.

9. The method of claim 8, wherein performing the Vt margin analysis occurs prior to programming the portion of the memory.

10. The method of claim 8, wherein identifying the portion of the memory last subject to programming operations during the determined asynchronous power loss includes identifying that the portion of the memory has memory cells that are:

subject to uncorrectable error correction code (ECC) errors;

partially programmed but appear to be erased; or incompletely programmed within a data state.

11. The method of claim 8, wherein identifying the portion of the memory last subject to programming operations includes identifying a LWP as the portion responsive to the LWP being subject to uncorrectable ECC errors.

12. The method of claim 8, wherein identifying the portion of the memory last subject to programming operations includes identifying a page subsequent to the LWP as the portion responsive to ECC errors of the LWP being correctable and RWB margins being adequate.

13. The method of claim 8, further comprising reducing a read voltage with respect to a default read voltage for a page subsequent to the LWP responsive to the page having adequate RWB margins.

14. The method of claim 8, further comprising reducing, for a page subsequent to the LWP, a read voltage to a lowest possible voltage corresponding to a particular data state responsive to the page having adequate RWB margins.

15. The method of claim 8, further comprising increasing the Vt by a pre-determined amount for a page subsequent to the LWP responsive to the page having adequate RWB margins.

16. An apparatus, comprising:

a memory; and a controller coupled to the memory, wherein the controller is configured to:

identify a portion of the memory last subject to erase operations at the time of an asynchronous power loss; and determine whether the portion of the memory has adequate read window budget (RWB) associated with an erased state based on a threshold voltage (Vt) margin analysis with respect to the erased state of the portion of the memory.

17. The apparatus of claim 16, wherein the controller is further configured to determine that:

the portion of the memory is indicated as being erased; and the portion of the memory is not fully programmed to the erased state.

18. The apparatus of claim 16, wherein the controller is further configured to determine whether errors on a last written page are error correction code correctable.

19. The apparatus of claim 16, wherein the controller is further configured to perform an erase verify operation on the portion of the memory using a read voltage that is less than a default erase verify operation read voltage.

20. The apparatus of claim 16, wherein the controller is further configured to increase the Vt for programming operations associated with the portion of the memory by a predetermined amount.

* * * * *